United States Patent
Nagasaka et al.

(10) Patent No.: US 7,433,160 B2
(45) Date of Patent: Oct. 7, 2008

(54) MAGNETORESISTIVE ELEMENT AND METHOD OF MANUFACTURING THE SAME

(75) Inventors: Keiichi Nagasaka, Kawasaki (JP); Yutaka Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 364 days.

(21) Appl. No.: 11/188,857

(22) Filed: Jul. 26, 2005

(65) Prior Publication Data
US 2006/0209471 A1 Sep. 21, 2006

(30) Foreign Application Priority Data
Mar. 17, 2005 (JP) ............................. 2005-078006

(51) Int. Cl.
*G11B 5/39* (2006.01)
(52) U.S. Cl. .................................. 360/324.1
(58) Field of Classification Search .............. 360/324.1, 360/324.11, 324.12, 324.2, 317, 322, 125, 360/126
See application file for complete search history.

(56) References Cited

U.S. PATENT DOCUMENTS

| | | | | |
|---|---|---|---|---|
| 7,038,890 | B2* | 5/2006 | Pinarbasi | 360/324.1 |
| 7,057,863 | B2* | 6/2006 | Cyrille et al. | 360/324.12 |
| 2004/0027731 | A1* | 2/2004 | Hasegawa et al. | 360/322 |
| 2004/0201920 | A1* | 10/2004 | Koide et al. | 360/128 |
| 2004/0246630 | A1* | 12/2004 | Otomo | 360/317 |
| 2004/0264069 | A1* | 12/2004 | Freitag et al. | 360/324.11 |
| 2005/0157434 | A1* | 7/2005 | Ito | 360/324.2 |
| 2005/0174702 | A1* | 8/2005 | Gill | 360/324.2 |
| 2005/0180061 | A1* | 8/2005 | Ding et al. | 360/324.12 |

FOREIGN PATENT DOCUMENTS

JP 2003-198005 7/2003

OTHER PUBLICATIONS

Atsushi Tanaka et al.; "Spin-Valve Heads in the Current-Perpendicular-to-Plane Mode for Ultrahigh-Density Recording", IEEE Transactions on Magnetics, vol. 38, No. 1, Jan. 2002, pp. 84-88.
Brian N. Chapman; "Glow Discharge Processes: sputtering and plasma etching", 1980, p. 354.

* cited by examiner

*Primary Examiner*—Tianjie Chen
(74) *Attorney, Agent, or Firm*—Westerman, Hattori, Daniels & Adrian, LLP.

(57) ABSTRACT

A magnetoresistive element is disclosed that includes a magnetoresistive film; a cap film configured to cover the magnetoresistive film and include a three-layer structure in at least a part thereof, the three-layer structure being formed of a third protection layer, a second protection layer, and a first protection layer in order from the magnetoresistive film side; and upper and lower terminals for applying a sense current perpendicularly to the surface of the magnetoresistive film. The magnetoresistive film includes a first magnetic layer whose direction of magnetization is changed by an external magnetic field, a second magnetic layer whose direction of magnetization is fixed with respect to the external magnetic field, and a nonmagnetic layer magnetically separating the first magnetic layer and the second magnetic layer.

10 Claims, 6 Drawing Sheets

MAGNETORESISTIVE ELEMENT AND METHOD OF MANUFACTURING THE SAME

CROSS-REFERENCE TO RELATED APPLICATION

The present application is based on Japanese Priority Patent Application No. 2005-078006, filed on Mar. 17, 2005, the entire contents of which are hereby incorporated by reference.

BACKGROUND OF THE INVENTION

1. Field of the Invention

The present invention relates generally to magnetoresistive elements, and more particularly to a magnetoresistive element having a so-called CPP (Current Perpendicular to Plane) structure that causes a sense current to flow in the direction of film thickness using a spin-valve (SV) film, and a method of manufacturing the same.

2. Description of the Related Art

In recent years, giant magnetoresistance (GMR) elements having a multilayer structure film of two ferromagnetic layers and a nonmagnetic metal film of, for instance, Cu sandwiched therebetween have been developed. GMR uses spin-dependent scattering in the ferromagnetic layers and at the interfaces. That is, GMR uses a property such that when the directions of magnetization of two magnetic layers are parallel, conduction electrons having spin in a certain direction are less likely to be scattered, thus resulting in low resistance; while the conduction electrons are more likely to be scattered, thus resulting in high resistance, when the directions of magnetization are antiparallel.

In magnetoresistive elements using a multilayer SV film, an antiferromagnetic body is brought close to one of two ferromagnetic layers so as to fix its direction of spin (a pinned layer), while the direction of magnetization of the other ferromagnetic layer is caused to be easily changeable with respect to an external magnetic field (a free layer). Using a property where the element resistance changes depending on the relative angle of the direction of magnetization between the two magnetic layers, the direction and size of an external magnetic field can be detected based on a change in the element resistance.

Such magnetoresistive elements are applied to and used in practice in magnetic sensors and the reproduction heads of hard disk drives.

In the conventional magnetoresistive element using an SV film, a resistance change in the in-plane direction of the SV film is detected by causing a sense current to flow in the film in-plane direction. Such a structure is referred to as CIP (Current In Plane) structure.

On the other hand, a magnetoresistive element of the CPP structure causing a sense current to flow in the direction of film thickness of an SV film to detect a resistance change in the film thickness direction has drawn attention as a' magnetoresistive element having higher density and higher sensitivity. The CPP magnetoresistive element, which has a characteristic such that the element output increases as the element size decreases, is promising as a highly sensitive reproduction head in high-density magnetic recorders (for instance, Atsushi Tanaka et al., "Spin-Valve Heads in the Current-Perpendicular-to-Plane Mode for Ultrahigh-Density Recording," IEEE Trans. Magn., Vol. 38, pp. 84-88, Jan. 2002).

Further, a CPP magnetoresistive element of a tunnel magnetoresistance (TMR) type that applies a perpendicular current to a tunnel junction film similar in structure to the SV film is also known (for instance, Japanese Laid-Open Patent Application No. 2003-198005).

In a CPP reproduction magnetic head using a magnetoresistive film such as an SV film or a TMR film, formation of the magnetoresistive film and formation of an upper shield or an upper terminal are not successively performed in the process of its shape formation.

FIG. 1 is a diagram showing a conventional CPP-SV (TMR) element. The conventional CPP-SV (TMR) element includes a multilayer magnetoresistive film 100 and an upper electrode 131 (also serving as a shield) and a lower electrode 121 (also serving as a shield) for causing current to flow through the magnetoresistive film 100. A lower metal film (terminal) 122, an antiferromagnetic pinning layer 123, a ferromagnetic pinned (fixed) layer 124, a non-magnetic layer (tunnel barrier layer) 125, a ferromagnetic free layer 126, and a cap layer 127 are stacked in order from the lower electrode 121 side. Reference numeral 128 denotes a hard magnetic layer, and reference numeral 129 denotes an insulating layer.

The cap layer 127 is a film protecting the magnetoresistive film 100. Because of the discontinuity of the formation process, a base having the magnetoresistive film 100 formed therein is placed in air before formation of an upper metal film 130 and the upper electrode (shield) 131. At this point, the cap layer 127 is provided in advance as a protection film in order to prevent the upper surface of the magnetoresistive film 100 from being oxidized in the air.

Conventionally, in order to reduce the contact resistance between the magnetoresistive film 100 and the upper electrode (shield) 131 or the upper metal film 130, part of the surface of the cap layer 127 in which resistance has increased because of oxidation is removed physically by etching before formation of the upper metal film 130 and the upper electrode (shield) 131, or a material difficult to oxidize, such as noble metal, is employed for the cap layer 127.

However, in the former method (physical removal), there is a problem in that a thick oxidation layer is formed, and that the film thickness controllability is low because of process-dependent variations in the formed oxidation layer.

According to the latter method, the oxidation layer to be removed is relatively thin. However, there is a problem in that the film thickness controllability is low because of high physical etching rates, and that tolerance to processing (such as resist patterning and oxygen ashing) cannot be obtained.

Accordingly, it is required to stabilize shape formation of elements, that is, to increase the yield of products, by selecting an appropriate material for the protection layer and selecting an effective element shape formation process.

According to aforementioned Japanese Laid-Open Patent Application No. 2003-198005, the need for removal of an oxidation film on the surface of a cap layer is eliminated by forming at least the surface part of the cap layer of a metal nitride, which is difficult to oxidize.

SUMMARY OF THE INVENTION

Accordingly, it is a general object of the present invention to provide a magnetoresistive element in which the above-described disadvantages are eliminated.

A more specific object of the present invention is to provide a magnetoresistive element of stable shape in which the final film thickness of a protection layer is controlled with accuracy.

Another more specific object of the present invention is to provide a method of manufacturing a magnetoresistive element that reduces process-dependent variations and forms a protection film of uniform film thickness with accuracy on a magnetoresistive film.

Yet another more specific object of the present invention is to provide a magnetic head using the above-described magnetoresistive element and a magnetic disk unit having such a magnetic head.

One or more of the above objects of the present invention are achieved by a magnetoresistive element, including: a magnetoresistive film; a cap film configured to cover the magnetoresistive film and include a three-layer structure in at least a part thereof, the three-layer structure being formed of a third protection layer, a second protection layer, and a first protection layer in order from a side of the magnetoresistive film; and upper and lower terminals for applying a sense current perpendicularly to a surface of the magnetoresistive film, wherein the magnetoresistive film includes a first magnetic layer whose direction of magnetization is changed by an external magnetic field, a second magnetic layer whose direction of magnetization is fixed with respect to the external magnetic field, and a nonmagnetic layer magnetically separating the first magnetic layer and the second magnetic layer.

According to one aspect of the present invention, a cap film protecting a magnetoresistive film is provided with a three-layer structure of first through third protection layers, and the material of each protection layer is selected based on its function. This configuration improves the controllability of the distance between the magnetoresistive film and an upper terminal, so that an element of stable shape can be obtained.

One or more of the above objects of the present invention are also achieved by a method of manufacturing a magnetoresistive element, including the steps of: (a) forming a magnetoresistive film on a lower terminal formed on a substrate; (b) forming a cap film by stacking a third protection film, a second protection film, and a first protection film in this order on the magnetoresistive film; (c) processing the cap film and the magnetoresistive film into a predetermined shape; (d) removing the first and second protection layers and part of the third protection layer of the cap film on a center part of the processed magnetoresistive film in a direction of width thereof; and (e) forming an upper terminal on the cap film after step (d).

According to the above-described manufacturing method, it is possible to control the film thickness of a third protection layer remaining immediately on a magnetoresistive film in the order of nanometers (nm). As a result, with the contact resistance between the magnetoresistive film and an upper terminal being reduced, it is possible to reduce the distance between the magnetoresistive film and the upper terminal with excellent controllability and improve reproduction density.

One or more of the above objects of the present invention are also achieved by a magnetic head including a magnetoresistive element according to the present invention; and an induction conversion element configured to convert a change in magnetic resistance of the magnetoresistive element detected by the sense current into induced voltage.

One or more of the above objects of the present invention are also achieved by a magnetic disk unit including a magnetic recording medium; a magnetic head; and an actuator arm configured to drive the magnetic head to a desired position above the magnetic recording medium, wherein the magnetic head includes a magnetoresistive element according to the present invention; and an induction conversion element configured to convert a change in magnetic resistance of the magnetoresistive element detected by the sense current into induced voltage.

Thus, according to one aspect of the present invention, the film thickness of a protection layer protecting a magnetoresistive film is controlled to be uniform in the process of manufacturing a magnetoresistive element, so that a reduction in the resistance of the element, a narrower read gap, and an increase in the yield of magnetic head manufacturing can be expected. As a result, a contribution can be made to the improvement of the performance of a magnetic disk unit.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given below, with reference to the accompanying drawings, of an embodiment of the present invention.

Figure 1:
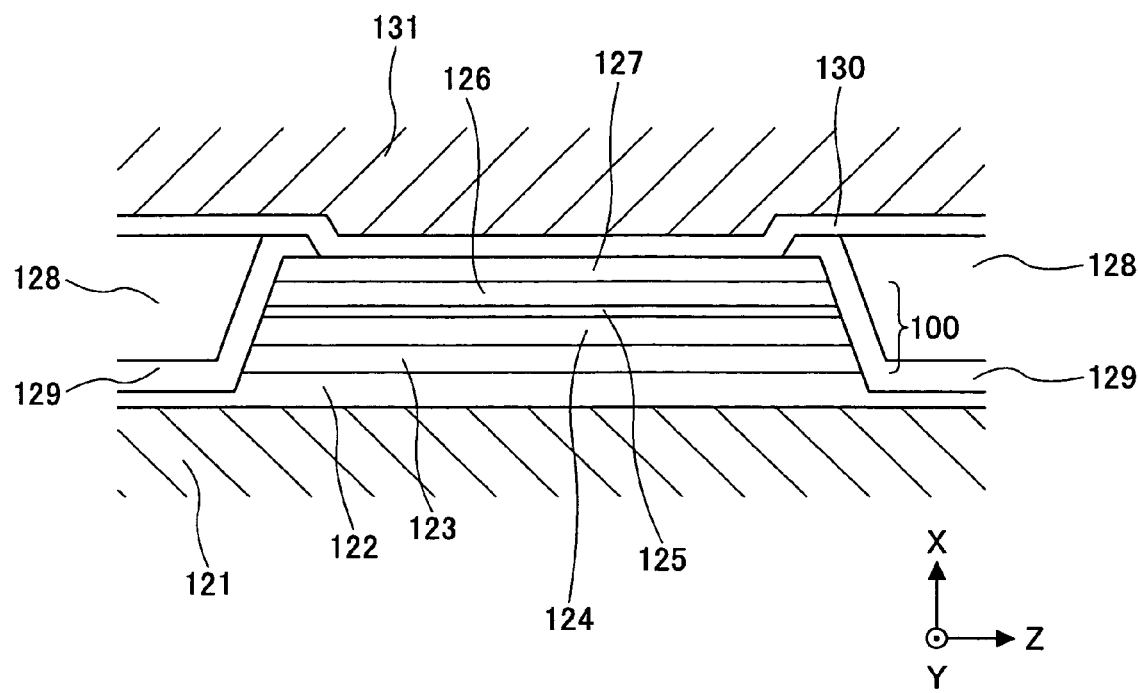
FIG. 1 is a schematic diagram showing a conventional CPP magnetoresistive element.
Figure 2:
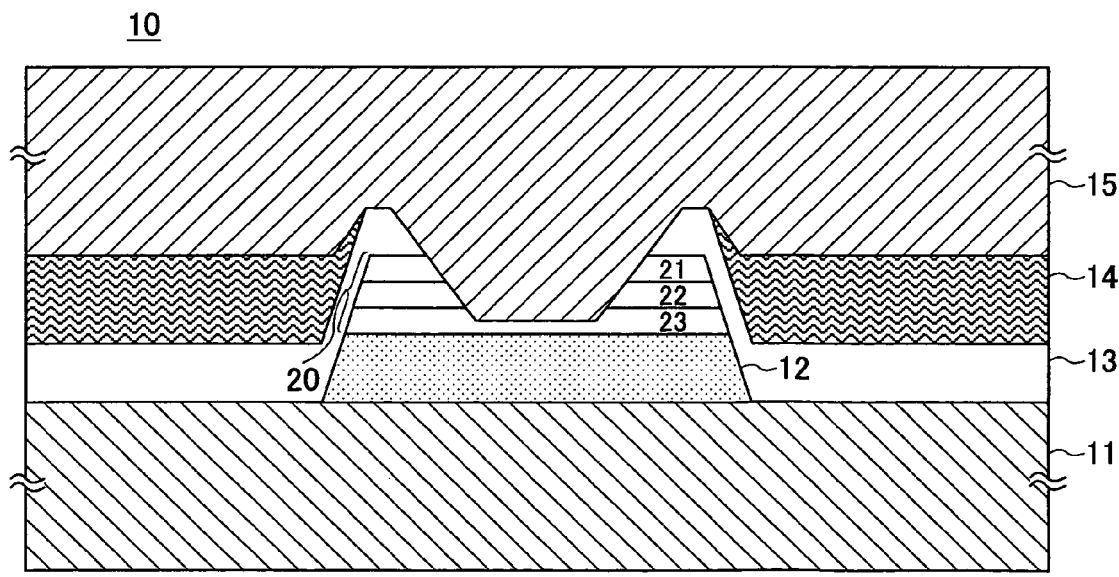
FIG. 2 is a schematic diagram showing a CPP magnetoresistive element according to an embodiment of the present invention.

FIG. 2 is a schematic diagram showing a CPP (Current Perpendicular to Plane) magnetoresistive element 10 according to the embodiment of the present invention. This magnetoresistive element 10 is employed as, for instance, part of the magnetic sensor (or reproduction head element) of a magnetic head.

The magnetoresistive element 10 includes a magnetoresistive film 12, an upper terminal 15 and a lower terminal 11 for supplying a sense current perpendicularly through the magnetoresistive film 12, a cap film 20 covering the magnetoresistive film 12, and a hard film (hard magnetic bias film) 14 for applying a bias magnetic field to the magnetoresistive film 12. At least a part of the cap film 20 is formed of three protection layers. The upper terminal 15 and the lower terminal 11 are isolated from each other by an insulating film 13.

In the case of FIG. 2, part of the cap film 20 which part covers the end part of the magnetoresistive film 12 includes a first protection layer 21, a second protection layer 22, and a third protection layer 23 in order from the upper surface side of the cap film 20. The upper terminal 15 and the lower terminal 11 also serve as an upper shield and a lower shield, respectively.

The first protection layer 21 is a layer of an oxide of a material, for instance, metal such as tantalum (Ta), that may be easy to oxidize but has high tolerance to processes from formation of the magnetoresistive film 12 to formation of the upper terminal 15. The film thickness of the first protection layer 21 is less than or equal to that of the natural oxide film of the metal.

The second protection layer 22 is a layer of a material that is difficult to oxidize and is low in specific resistance (lower than or equal to 300 μΩcm) even if oxidized, for instance, noble metal such as Au, Ag, Rh, Ru, Pd, Os, Ir, and Pt.

The third protection layer 23 is a layer using a material having low specific resistance (lower than or equal to 300 μΩcm) and a low physical etching rate, such as Ti, Ta, W, Nb, Th, V, Zr, Be, Hf, Re, or Mo. For these materials, reference should be made to Chapman, B. N.; Glow Discharge Processes: sputtering and plasma etching, Denki Shoin, pp. 354-356 (Japanese translation of the original, translated by Yukio Okamoto).

Using a material having high tolerance to element formation processes of resist patterning and oxygen ashing for the uppermost first protection layer 21 makes it possible to control film reduction during the processes.

Using a material difficult to oxidize and low in specific resistance even if oxidized for the second protection layer 22 immediately under the first protection layer 21 makes it possible to control the physical film thickness of the first protection layer 21 in a restrictive manner.

Using a material having a low physical etching rate for the third protection layer 23 immediately on the magnetoresistive film 12 makes it possible to increase the controllability of the film thickness of the cap film 20 finally remaining on the magnetoresistive film 12. This means the improvement of the distance between the upper terminal 15 and the lower terminal 11 applying a sense current to the magnetoresistive film 12, that is, the controllability of a reproduction gap. When reproduction gap controllability improves, further improvement of the recording density of a magnetic disk unit can be expected.

Any combination of the above-described materials can be employed as the first through third protection layers 21 through 23. In any case, the above-described effects can be achieved. For instance, tantalum (Ta) and ruthenium (Ru) are materials commonly used to configure a magnetoresistive film. Selecting a multilayer structure of Ta/Ru/Ta as the structure of the first through third protection layers 21 through 23 of the cap film 20 is advantageous in that the selection can be dealt with satisfactorily with existing materials and an existing manufacturing apparatus. The first through third protection layers 21 through 23 may also be configured with any other of the above combinations.

Figure 3:
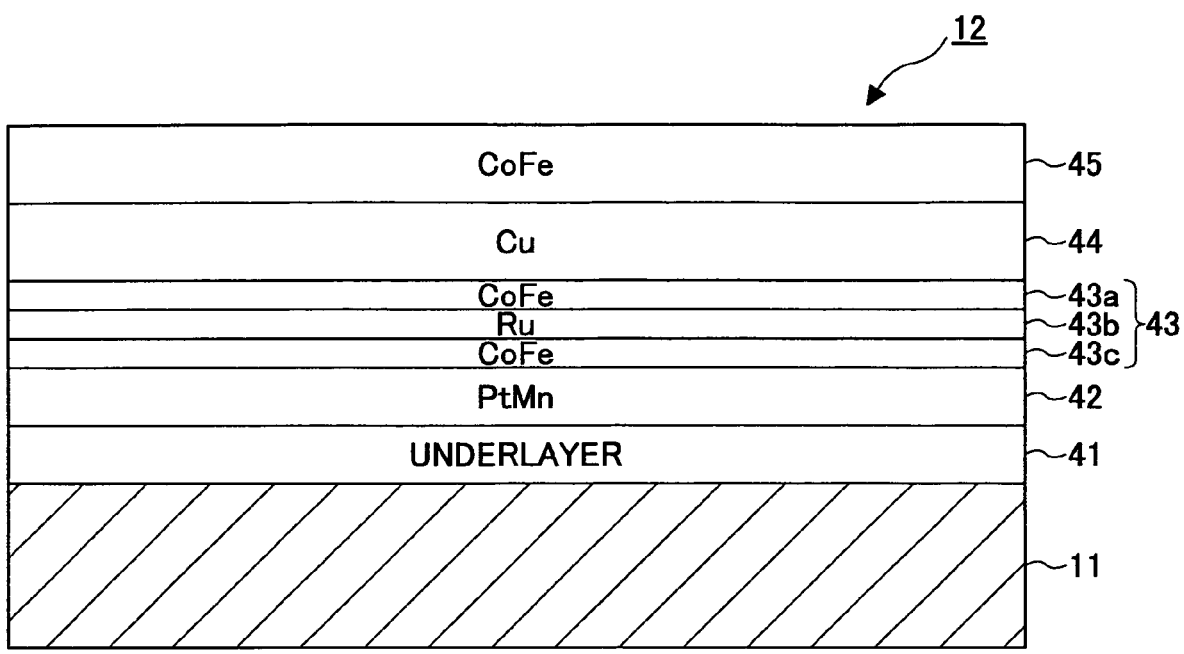
FIG. 3 is a schematic diagram showing a configuration of a magnetoresistive film (spin-valve film) employed in the magnetoresistive element of FIG. 2 according to the embodiment of the present invention.

FIG. 3 is a schematic diagram showing a configuration of the magnetoresistive (spin-valve) film 12 of FIG. 2. According to the present invention, any magnetoresistive film configuration may be employed as the configuration of the magnetoresistive film 12. The configuration shown in FIG. 3 is merely an example.

The magnetoresistive film 12, which is stacked on the lower terminal 11 through an underlayer 41, includes a free layer (first magnetic layer) 45 in which the direction of magnetization is changed by application of an external magnetic field, a pinned layer (second magnetic layer) 43 in which the direction of magnetization is fixed with respect to an external magnetic field, a nonmagnetic layer 44 positioned between the two magnetic layers 45 and 43, and an antiferromagnetic layer 42 for fixing the direction of magnetization of the pinned layer 43.

The free layer 45, which is a ferromagnetic body magnetically showing soft magnetism, is formed of a material such as Fe, Co, Ni, CoFe, NiFe, or CoZrNb. In the case of FIG. 3, the free layer 45 is formed of, for instance, CoFe of 4 nm in thickness.

The pinned layer 43 is also formed of a ferromagnetic material as that of the free layer 45. However, the pinned layer 43 has its direction of magnetization fixed by the antiferromagnetic layer 42 so as to magnetically show hard magnetism. In the case of FIG. 3, the pinned layer 43 is formed of, for instance, three layers 43a, 43b, and 43c of CoFe/Ru/CoFe, respectively.

The free layer 45 and the pinned layer 43 are magnetically separated by the nonmagnetic layer 44 having a current-carrying function. In the case of FIG. 3, the nonmagnetic layer 44 is formed of copper (Cu).

The antiferromagnetic layer 42, which fixes the direction of magnetization of the pinned layer 43, is formed of a manganese (Mn)-based alloy. In the case of FIG. 3, a platinum-manganese (PtMn) alloy is used for the antiferromagnetic layer 42.

FIGS. 4A through 4F are diagrams showing a manufacturing process of the magnetoresistive element 10 shown in FIG. 2.

Figure 4A:
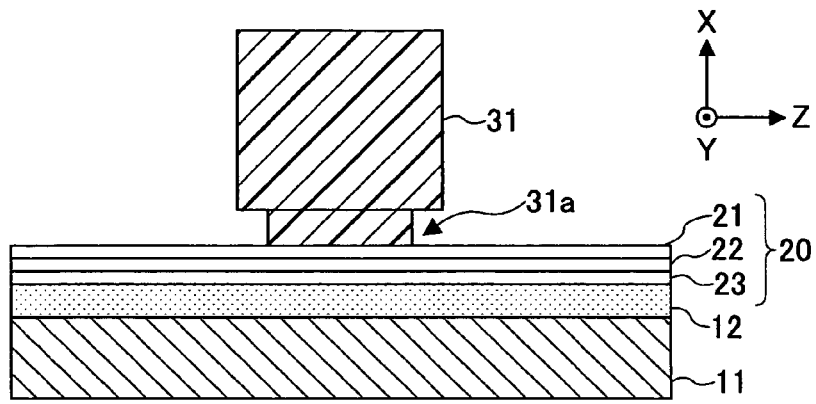
FIGS. 4A through 4F are diagrams showing a manufacturing process of the magnetoresistive element of FIG. 2 according to the embodiment of the present invention.

First, as shown in FIG. 4A, the magnetoresistive film 12 of the configuration of FIG. 3 and the cap film 20 formed of the first through third protection layers 21 through 23 are successively stacked on the lower terminal 11 formed on a base or substrate of, for instance, alumina (not graphically illustrated). A resist pattern 31 of a predetermined shape is formed on the cap film 20.

In this embodiment, the lower terminal 11 also functions as a magnetic shield. The lower terminal 11 is, for instance, NiFe of approximately 1 μm to several μm in film thickness, and is formed by plating. The magnetoresistive film 12 is successively stacked by, for instance, DC magnetron sputtering.

For the third protection layer 23 immediately on the magnetoresistive film 12, a material having low specific resistance (for instance, lower than or equal to 300 μΩcm) and a low physical etching rate is sputtered. In this embodiment, it is desirable that the sputtering rate be lower than or equal to 1 at an Ar$^+$ ion input energy of 600 eV. Materials satisfying such conditions include Ti, Ta, W, Nb, Th, V, Zr, Be, Hf, Re, and Mo.

The second protection layer 22 formed by sputtering successively after the third protection layer 23 is a layer of noble metal such as Au, Ag, Rh, Ru, Pd, Os, Ir, or Pt, which is difficult to oxidize.

The first protection layer 21 formed by sputtering successively after the second protection layer 22 is a layer of an oxide of a material, for instance, metal such as tantalum (Ta), that has high tolerance to processes of resist pattering, oxygen ashing, etc., performed before formation of the upper terminal 15. When making the first protection layer 21 of a metal oxide film, the oxide layer may be formed by reactive sputtering using oxygen gas or by air exposure or oxygen ashing after formation of a metal layer.

The resist pattern 31 is formed using photolithography technology. In the case of FIG. 4A, the Z-axis directions correspond to the directions of element width, and the Y-axis directions correspond to the directions of element height. The resist pattern 31 is shaped to be narrower in a lower layer than in an upper layer so as to have a constricted part 31a. This shape enables or facilitates a lift-off process described below.

Figure 4B:
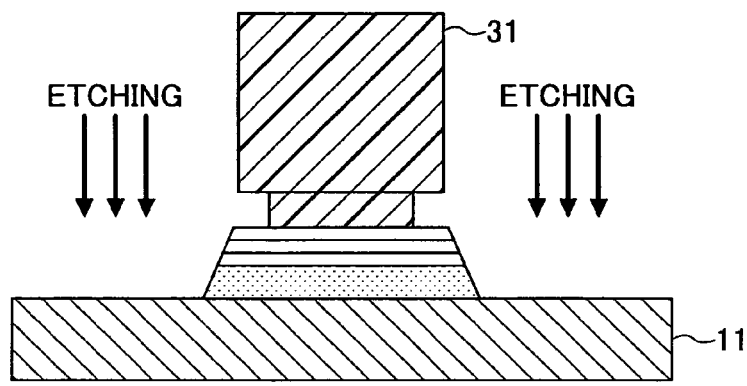

Next, as shown in FIG. 4B, the cap film 20 and the magnetoresistive film 12 are removed in a region not covered with the resist pattern 31 using, for instance, ion milling. The width of the upper part of the resist pattern 31 is dominant with respect to the width of the resultant magnetoresistive film 12

(element width). As a result, the element width is slightly greater than the width of the lower part of the resist pattern 31. The final element width is, for instance, approximately 100 nm.

Figure 4C:
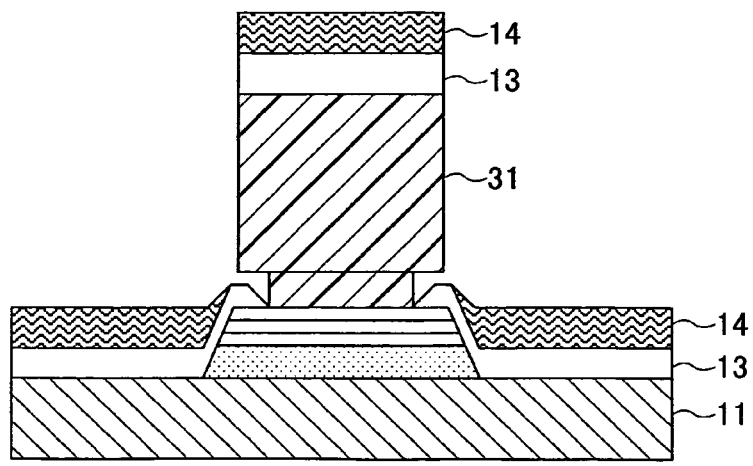

Next, as shown in FIG. 4C, with the resist pattern 31 being left in place the insulating layer 13, which isolates the upper and lower terminals 15 and 11, and the hard film (hard magnetic bias film) 14, which controls the direction of magnetization of the free layer 45 of the magnetoresistive film 12, are deposited. Finally, these films 13 and 14 are formed so as to surround the constricted part 31a of the resist pattern 31.

Figure 4D:
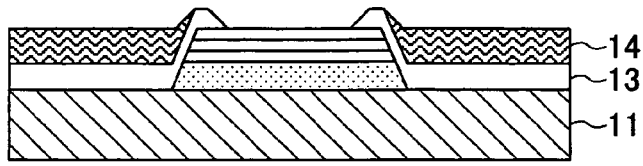

Next, as shown in FIG. 4D, the resist pattern 31 is dissolved using an organic solvent so that the insulating film 13 and the hard film 14 formed on the resist pattern 31 are removed. This is so-called lift-off. As a result of this process, both (Z-axial) end parts of the magnetoresistive element 10 are covered with the insulating film 13 and the hard film 14. At this point, the topmost surface of the cap film 20 covering the magnetoresistive film 12 is a high-resistance layer such as an oxide film.

Figure 4E:
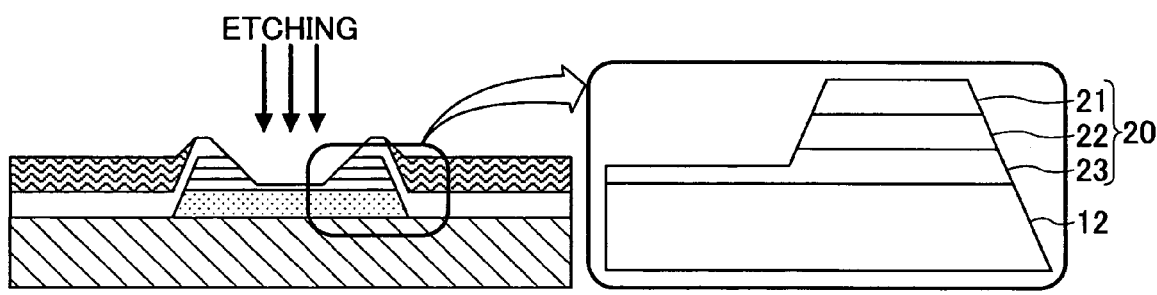

Next, as shown in FIG. 4E, before forming the upper terminal 15, the cap film 20 on the magnetoresistive film 12 is partially removed by etching in order to reduce the contact resistance between the magnetoresistive film 12 and the upper terminal 15. The cap film 20 is defined by the first protection layer 21, the second protection layer 22, and the third protection layer 23. Accordingly, the film thickness of a protection film to be removed can be controlled by applying an appropriate etching rate to each of the first through third protection layers 21 through 23. On the center part of the magnetoresistive film 12, the first protection layer 21, which is a high-resistance layer, should be removed completely. The second protection layer has low resistance but a high etching rate. Accordingly, etching is stopped inside the third protection layer 23 having a low etching rate. As a result, even when etching stop time is calculated from an etching rate, it is possible to ensure a margin of the stop time. This leads to an increase in a process margin. Further, it is also possible to control the film thickness of the third protection layer 23 that finally remains without being removed to a small value. Accordingly, it is possible to form a reproduction head having a reduced (narrowed) reproduction gap between upper and lower terminals with an excellent yield.

Figure 4F:
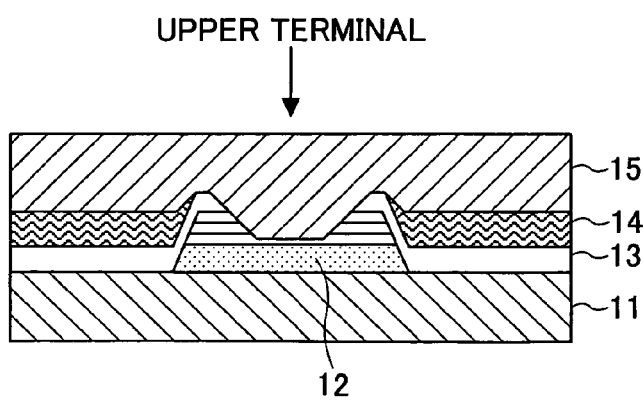

Finally, as shown in FIG. 4F, the upper terminal 15 is formed, so that the CPP magnetoresistive element 10 in which current is caused to flow in a direction perpendicular to the surface of the magnetoresistive film 12 is completed. In this element 10, the film thickness of the third protection layer 23 covering the center part of the magnetoresistive film 12 is controlled to a small value with accuracy. Accordingly, the distance between the upper terminal 15 and the lower terminal 11 for applying a sense current perpendicular to the film surface of the magnetoresistive film 12 can be reduced with excellent controllability, thereby contributing to the improvement (increase) of reproduction density.

Further, according to the magnetoresistive element manufacturing method of this embodiment, etching of the cap film 20 can be controlled with excellent accuracy. Accordingly, a magnetoresistive element having a narrowed reproduction gap can be manufactured with stability. As a result, the manufacturing yield increases.

Further, according to the magnetoresistive element manufacturing method of this embodiment, it is possible to control the film thickness of a third protection layer remaining immediately on a magnetoresistive film in the order of nanometers (nm). As a result, with the contact resistance between the magnetoresistive film and an upper terminal being reduced, it is possible to reduce the distance between the magnetoresistive film and the upper terminal with excellent controllability and improve reproduction density.

According to a magnetoresistive element of the present invention, the film thickness of a third protection layer finally covering the center part of a magnetoresistive film is controlled to be uniform. As a result, the controllability of the distance between the magnetoresistive film and an upper terminal is improved, so that an element of stable shape can be obtained.

Figure 5:
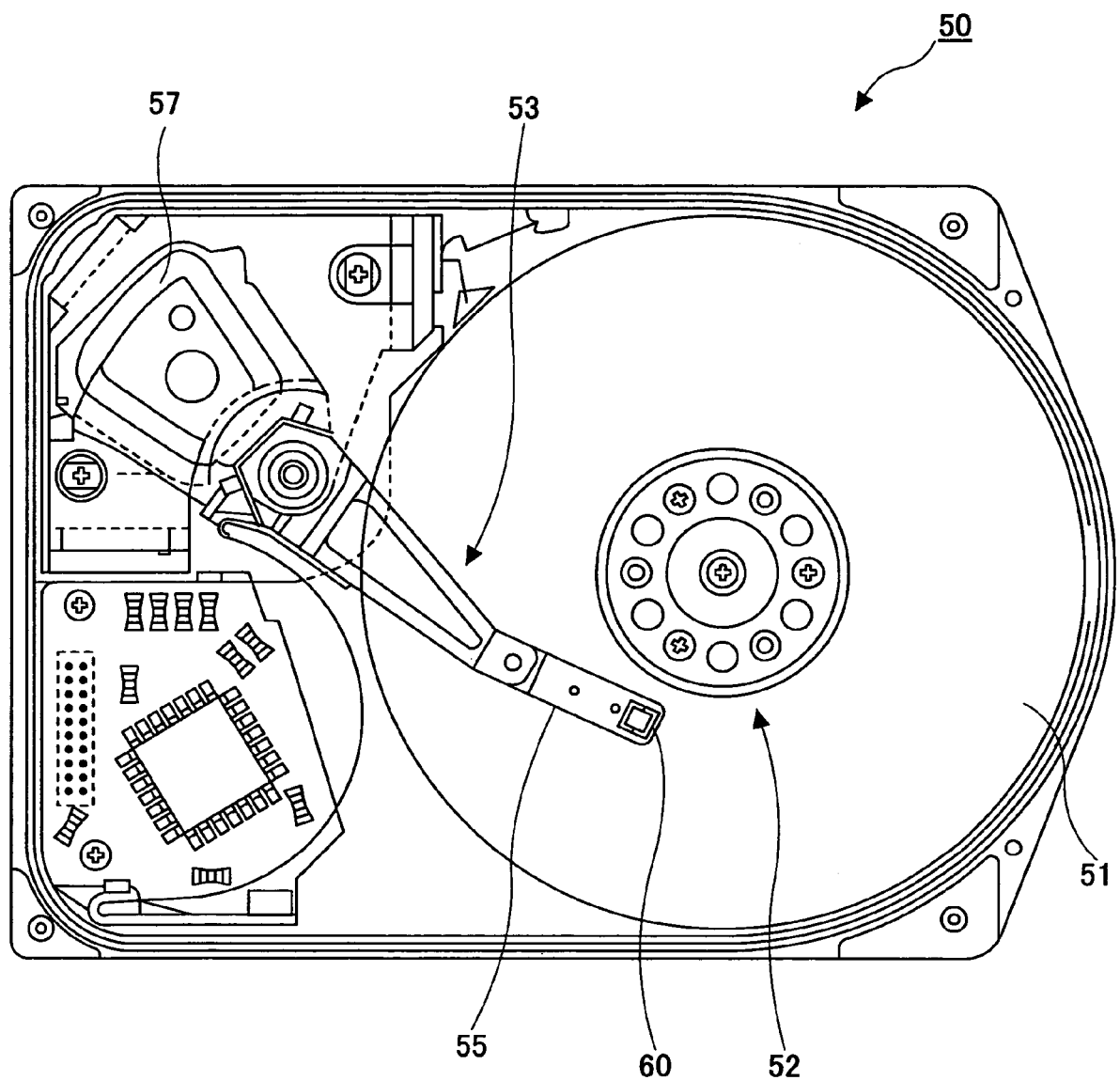
FIG. 5 is a schematic diagram showing a magnetic disk unit having a magnetic head using the magnetoresistive element shown in FIG. 2 according to the embodiment of the present invention.

FIG. 5 is a schematic diagram showing a magnetic disk unit 50 using the magnetoresistive element 10 according to the embodiment of the present invention. The magnetic disk unit 50 includes a magnetic disk 51 that is a recording medium, a spindle 52 rotated by a drive mechanism (not graphically illustrated) with the magnetic disk 51 being attached thereto, and a magnetic head assembly 53 performing reading from and writing to the magnetic disk 51. The magnetic head assembly 53 includes a magnetic head 60 that reads a magnetic field generated on the magnetic disk 51 and writes information magnetically onto the magnetic disk 51, an actuator arm 57 that drives (moves) the magnetic head 60 to a desired position above (relative to) the magnetic disk 51, and a suspension 55 that holds the magnetic head 60 at its end.

Figure 6:
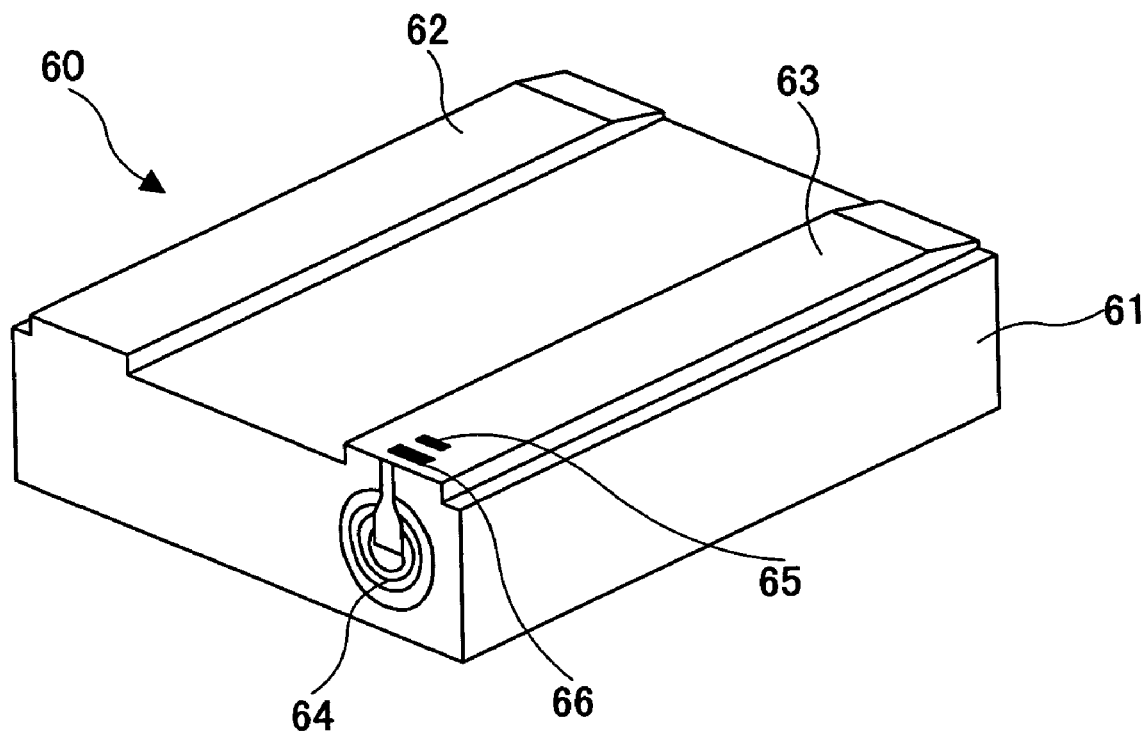
FIG. 6 is a perspective view of the magnetic head of FIG. 5 according to the embodiment of the present invention.

FIG. 6 is a perspective view of the magnetic head shown in FIG. 5. The magnetic head 60 includes a head slider (base) 61, rails 62 and 63, a coil 64, a recording head element 66, and a reproduction head element (magnetic sensor) 65. The head slider 61 runs above the magnetic disk 51 in a floating state, being extremely close to the surface of the magnetic disk 51. The rails 62 and 63 form air bearing surfaces with respect to the surface of the magnetic disk 51. The recording head element 66 writes information onto the magnetic disk 51. The reproduction head element 65 reads information recorded on the magnetic disk 51. The reproduction head element 65 includes the structure shown in FIGS. 2 and 3.

The reproduction head element 65 detects, with the magnetoresistive element 10 (FIG. 2), a change over time in a magnetic field leaking out from the magnetic disk 51 moving relative to the magnetic head 60, and obtains an output by converting a resistance change into induced voltage.

The recording head element 66 performs writing by generating a magnetic flux having a direction and strength corresponding to a signal by applying current to the writing coil 64, and forming a magnetic domain corresponding to the signal on a track (not graphically illustrated) of the magnetic disk 51.

The magnetic head 60 according to this embodiment employs the reproduction head element 65 in which a reproduction gap is reduced with excellent controllability. Accordingly, it is possible to improve the accuracy and density of reproduction from the magnetic disk 51.

Thus, according to one aspect of the present invention, the film thickness of a protection layer protecting a magnetoresistive film is controlled to be uniform in the process of manufacturing a magnetoresistive element, so that a reduction in the resistance of the element, a narrower read gap, and an increase in the yield of magnetic head manufacturing can be expected. As a result, a contribution can be made to the improvement of the performance of a magnetic disk unit.

The present invention is not limited to the specifically disclosed embodiment, and variations and modifications may be made without departing from the scope of the present invention.

What is claimed is:

1. A magnetoresistive element, comprising:
   a magnetoresistive film;

a cap film configured to cover the magnetoresistive film and include a three-layer structure in at least a part thereof, the three-layer structure being formed of a third protection layer, a second protection layer, and a first protection layer in order from a side of the magnetoresistive film; and upper and lower terminals for applying a sense current perpendicularly to a surface of the magnetoresistive film, wherein the magnetoresistive film includes a first magnetic layer whose direction of magnetization is changed by an external magnetic field, a second magnetic layer whose direction of magnetization is fixed with respect to the external magnetic field, and a nonmagnetic layer magnetically separating the first magnetic layer and the second magnetic layer; and wherein the third protection layer is in direct contact with the magnetoresistive film.

2. The magnetoresistive element as claimed in claim 1, wherein:

the first protection layer comprises an oxide of metal; and a film thickness of the first protection layer is less than or equal to a film thickness of a natural oxide film of the metal.

3. The magnetoresistive element as claimed in claim 1, wherein the second protection layer comprises metal that is difficult to oxidize and has a specific resistance of 300 μΩcm or less.

4. The magnetoresistive element as claimed in claim 1, wherein the third protection layer comprises a material having a specific resistance of 300 μΩcm or less and a sputtering rate of 1 or less at an argon (Ar+) ion input energy of 600 eV as a physical etching rate.

5. The magnetoresistive element as claimed in claim 1, wherein the magnetoresistive film is covered only with the third protection layer in a center part thereof in a direction of element width, and is covered with the three-layer structure in an end part thereof in the direction of the element width.

6. A magnetic head, comprising:

a magnetoresistive element as set forth in claim 1; and an induction conversion element configured to convert a change in magnetic resistance of the magnetoresistive element detected by the sense current into induced voltage.

7. The magnetic head as claimed in claim 6, further comprising:

a recording head element configured to generate a magnetic flux of strength and a direction corresponding to an input signal.

8. A magnetic disk unit, comprising:

a magnetic recording medium;

a magnetic head; and an actuator arm configured to drive the magnetic head to a desired position above the magnetic recording medium, wherein the magnetic head includes a magnetoresistive element as set forth in claim 1; and an induction conversion element configured to convert a change in magnetic resistance of the magnetoresistive element detected by the sense current into induced voltage.

9. The magnetic disk unit as claimed in claim 8, wherein the magnetic head further includes a recording head element configured to generate a magnetic flux of strength and a direction corresponding to an input signal.

10. The magnetoresistive element as claimed in claim 1, wherein an entire bottom surface of the third protection layer directly contacts an entire upper surface of the magnetoresistive film.

* * * * *